(12) United States Patent
Haraguchi

(10) Patent No.: US 7,719,037 B2
(45) Date of Patent: May 18, 2010

(54) IMAGE SENSOR HAVING RESET TRANSISTOR

(75) Inventor: Yoshizumi Haraguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 415 days.

(21) Appl. No.: 11/806,312

(22) Filed: May 31, 2007

(65) Prior Publication Data

US 2007/0278537 A1 Dec. 6, 2007

(30) Foreign Application Priority Data

May 31, 2006 (JP) .............................. 2006-151057

(51) Int. Cl.
*H01L 29/768* (2006.01)
(52) U.S. Cl. ...................... 257/239; 257/225; 257/231; 257/232; 250/208.1; 348/294; 348/311; 348/317; 348/320; 348/322
(58) Field of Classification Search ................. 257/225, 257/231, 232, 239; 250/208.1; 348/294, 348/308, 311, 312, 317, 320, 322
See application file for complete search history.

(56) References Cited

U.S. PATENT DOCUMENTS

2003/0112352 A1* 6/2003 Tanaka ........................ 348/308
2005/0269636 A1* 12/2005 Yoshida ....................... 257/347

FOREIGN PATENT DOCUMENTS

| JP | 01-103872 | 4/1989 |
| JP | 1-196175 | 8/1989 |
| JP | 6-205309 | 7/1994 |
| JP | 2578615 | 11/1996 |
| JP | 11-150685 | 6/1999 |
| JP | 2005-317993 | 11/2005 |

* cited by examiner

*Primary Examiner*—Victor A Mandala
*Assistant Examiner*—Whitney Moore
(74) *Attorney, Agent, or Firm*—Young & Thompson

(57) ABSTRACT

An image sensor includes a reset transistor, reset gate electrodes and a potential shift circuit. The reset transistor includes a reset gate and a reset drain, and resets charges detected by a charge detection device. The reset gate electrodes control a potential of the reset gate. The potential shift circuit initializes output signals in response to a shift pulse, and outputs the output signals to the reset gate electrodes in response to a reset pulse.

13 Claims, 15 Drawing Sheets

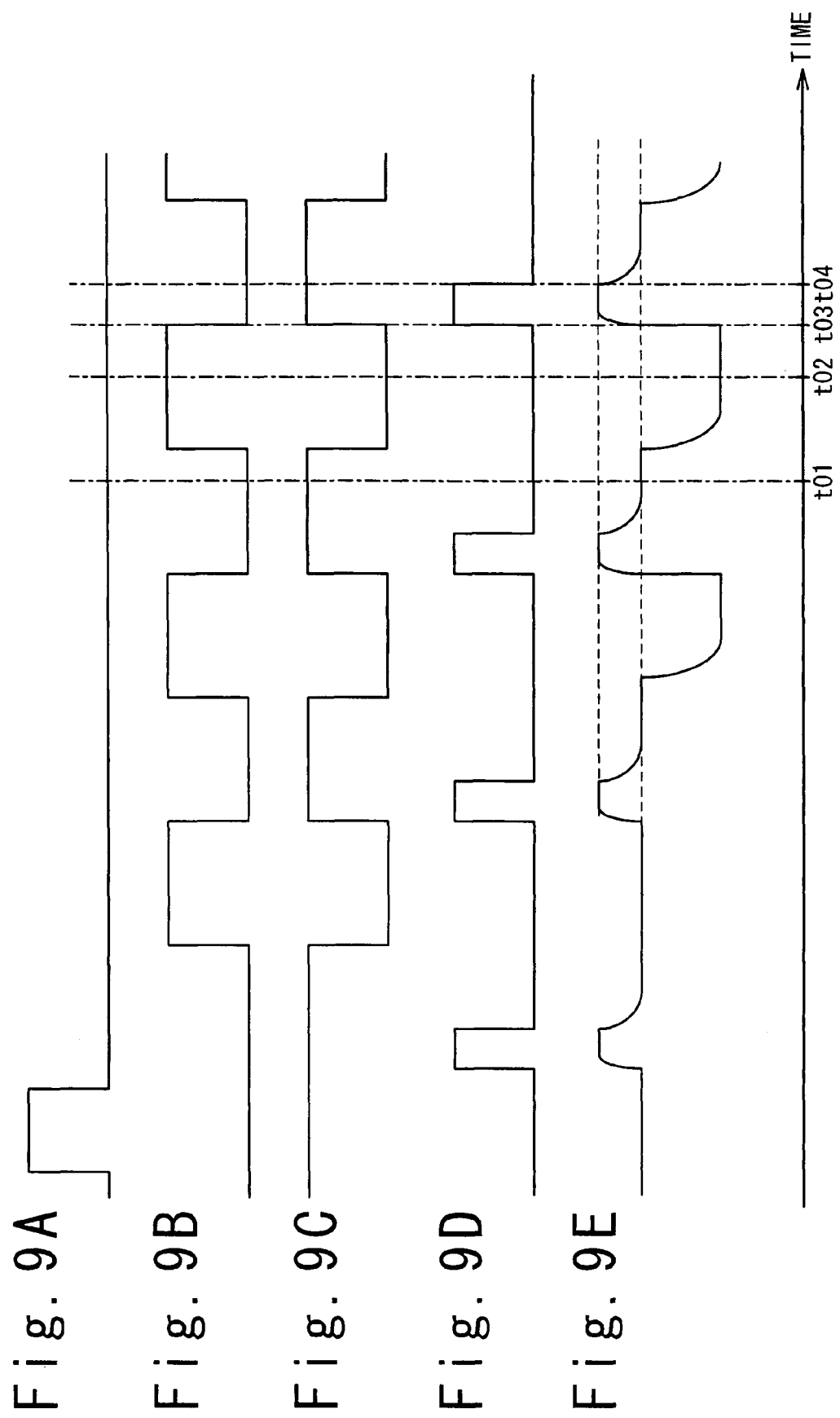

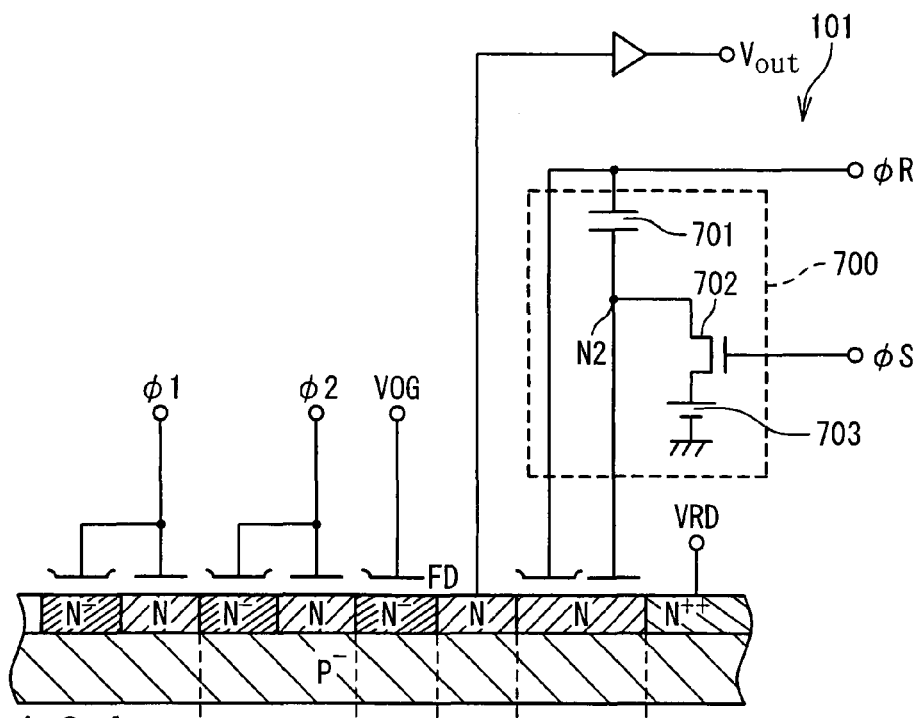
Fig. 10A
Fig. 10B
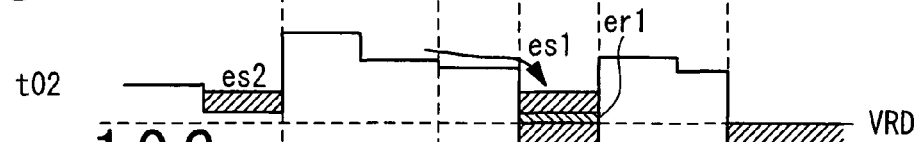
Fig. 10C
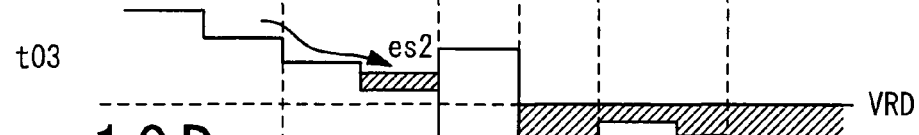
Fig. 10D
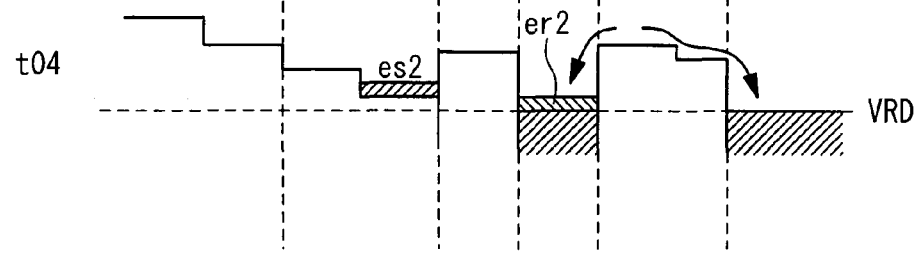

IMAGE SENSOR HAVING RESET TRANSISTOR

BACKGROUND OF THE INVENTION

1. Field of the Invention

The present invention relates to an image sensor, particularly an image sensor such as a CCD (charge coupled device) image sensor having a reset transistor.

2. Description of Related Art

In accordance with diffusion of digital cameras and mobile phones with cameras, CCD image sensors have been distributed to the market. The CCD image sensor, which is disclosed in Japanese Laid-Open Patent Application JP-A-Heisei 1-196175, is provided with a light-receiving element, a CCD, and a FDA (floating diffusion amplifier). The light-receiving element converts or photoelectrically converts light into signal charges and accumulates the signal charges. The CCD transfers the signal charges accumulated in the light-receiving element into the FDA. The FDA detects the transferred signal charges and converts them into an electric signal or a voltage.

On the basis of an amount of transferred signal charges, the FDA converts the charge amount into a voltage. The FDA is provided with a reset transistor in a rear stage thereof. The reset transistor is provided with a reset gate and a reset drain. The reset transistor provides the reset drain with the charges converted to the voltage by the FDA. Therefore, in the CCD image sensor, it is prevented to mix charges that were already detected by the FDA, and charges to be detected.

FIG. 1 is a sectional view showing a constitution of the above-mentioned CCD image sensor 11 disclosed in the Japanese Laid-Open Patent Application JP-A-Heisei 1-196175. The disclosed CCD image sensor 11 is provided with a CCD register transfer electrode portion 13 and a floating diffusion 15. The CCD register transfer electrode portion 13 is formed on a P substrate 12. The floating diffusion 15 converts charges transferred from the CCD register transfer electrode 13 into a signal voltage, and is formed on the P substrate 12. The CCD image sensor 11 also has a reset transistor composed by the floating diffusion 15, a reset gate electrode 16, and a reset drain 17. The reset transistor resets a potential of the floating diffusion 15 to a reference potential at a predetermined timing.

Referring to FIG. 1, an output gate electrode 14 is provided between the CCD register transfer electrode portion 13 and the floating diffusion 15. The output gate electrode 14 provides the transferred charges for the floating diffusion 15 at a predetermined timing. The floating diffusion 15 is further connected to an output amplifier 18, and the floating diffusion 15 converts transferred charges into a signal voltage which is provided for the output amplifier 18. The output amplifier 18 amplifies the signal voltage to output from an output node Vout.

A reset pulse ΦR is applied to the reset gate electrode 16 of which the reset transistor is composed. The CCD register transfer electrode portion 13 is provided with a first transfer electrode and a second transfer electrode. The first transfer electrode is operated in response to a first clock Φ1. The second transfer electrode is operated in response to a second clock Φ2. As shown in FIG. 1, an N diffusion region and an N– diffusion region that are formed in the P substrate 12 are provided in a lower part of the first transfer electrode. Therefore, the N diffusion region of the first transfer electrode acts as a storage electrode with the potential that is made deeper in response to the first clock Φ1. The N– diffusion region of the first transfer electrode acts as a barrier electrode with the potential that is made shallower in response to the first clock Φ1.

That is, the first transfer electrode includes a pair of the storage electrode and the barrier electrode. Similarly, the second transfer electrode includes a pair of a storage electrode with the potential thereunder that is made deeper, and a barrier electrode with the potential thereunder that is made shallower, in response to the second clock Φ2. As shown in FIG. 1, an N– diffusion region is formed in a lower part of the output gate electrode 14 in the P substrate 12. An output gate voltage VOG is applied to the output gate electrode 14.

An operation timing of the disclosed CCD image sensor 11 will be explained below referring to a drawing. FIGS. 2A to 2D are timing charts showing an operation of the disclosed CCD image sensor 11. A waveform shown in FIG. 2A indicates the first clock 11. A waveform shown in FIG. 2B indicates the second clock Φ2. A waveform shown in FIG. 2C indicates the reset pulse ΦR. A waveform shown in FIG. 2D indicates a signal voltage from the output node Vout.

Referring to FIGS. 2A to 2D, the first clock Φ1 exhibits a low level and the second clock Φ2 exhibits a high level at time t11. At time t12, the first clock Φ1 is brought into the high level, and the second clock Φ2 is brought into the low level. At this time, the reset pulse ΦR maintains the low level. At time t13, the reset pulse ΦR is inverted from the low level to the high level. At this time, the first clock Φ1 and the second clock Φ2 are also inverted. The reset pulse ΦR maintains the high level from time t13 through time t14 up to time t15. At time t15, the reset pulse ΦR is inverted from the high level to the low level. Furthermore, at time t16, the reset pulse ΦR is brought into the same state as that of time 11.

A charge transfer at the above-mentioned operation timing will be explained below referring to a drawing. FIGS. 3A to 3D are views showing changes and potentials in the disclosed CCD image sensor 11. FIGS. 3A to 3D show situations in which charges are transferred by changing a potential depth in response to a voltage applied to each of the electrodes in the CCD image sensor 11. Referring to FIGS. 3A to 3D, in the disclosed CCD image sensor 11, a potential from the first transfer electrode to the second transfer electrode becomes a stepwise state at time t11. At this time, the output gate voltage VOG is set such that the output gate electrode 14 becomes a barrier. Therefore, signal charges es1 are accumulated in the storage electrode of the second transfer electrode. At time t11, the reset pulse ΦR in the low level is applied to the reset gate electrode 16. Therefore, an N type diffusion region disposed between the floating diffusion 15 and the reset drain 17 in a lower part of the reset gate electrode 16 becomes a potential barrier to separate both of the floating diffusion 15 and the reset drain 17.

At time 12, the first clock Φ1 and the second clock Φ2 are inverted. Accordingly, signal charges es2 obtained from a transfer electrode in the previous stage (not shown) are transferred to the storage electrode of the first transfer electrode. At this time, the charges es1 which were transferred to the storage electrode of the second transfer electrode are transferred to the floating diffusion 15. The floating diffusion 15 responds to the transferred charges and converts an amount of the charges into a signal voltage which is outputted to the output amplifier 18.

At time t13, the reset pulse ΦR in the high level is applied to the reset gate electrode 16. Therefore, the potential under the reset gate electrode 16 is made deeper than the potential under the floating diffusion 15. Thereafter, at time t14, the reset gate electrode 16 stops to act as the potential barrier, so that the charges in the floating diffusion 15 is outputted to the reset drain 17.

Next, at time t15, the reset pulse ΦR is brought into the low level. At this time, the potential under the reset gate electrode 16 is decreased. The reset transistor is turned off by the reset pulse ΦR that is brought into the low level. At this time, the charges that existed in the N type diffusion region under the reset gate electrode 16 at time t14 is distributed to both directions of the floating diffusion 15 and the reset drain 17.

If the floating diffusion 15 is in a floating state, the distributed charges er1 or charges er2 are made to be a reset feedthrough noise (hereinafter, referred to as a reset noise). The reset noise shifts the potential of the floating diffusion 15 to a low potential. Referring to FIG. 2D, the potential of the output node Vout at time t16 is shifted from a VRD level to a reset feed-through level $V_F1$.

In the disclosed CCD image sensor 11, a reset feed-through noise which is a difference between the VRD level and the reset feed-through level $V_F1$ is outputted as a reset noise $V_{RF}1$. The reset noise $V_{RF}1$ occasionally causes a demerit such as deteriorating a pixel signal and narrowing a dynamic range of an amplifier circuit. Therefore, there is known a technique to reduce a reset noise.

Japanese Laid-Open Patent Application JP-A-Heisei 6-205309 discloses the technique to reduce the reset noise. FIG. 4 is a sectional view showing a constitution of a CCD image sensor 23 described in the Japanese Laid-Open Patent Application JP-A-Heisei 6-205309. The CCD image sensor 23 is provided with a reset gate electrode 20 between the floating diffusion 15 and the reset drain 17. Referring to FIG. 4, the reset gate electrode 20 includes a first reset gate electrode 21 and a second reset gate electrode 22. As shown in FIG. 4, the reset pulse ΦR is applied to the first reset gate electrode 21. The second reset gate electrode 22 is connected to a resistance R101, and the reset pulse ΦR is applied via the resistance R101. Expect for this constitution, the CCD image sensor 23 is the same as the above-mentioned CCD image sensor 11.

FIGS. 5A to 5E are timing charts showing an operation of the CCD image sensor 23. FIG. 5A exhibits a waveform of the first clock Φ1. FIG. 5B exhibits a waveform of the second clock Φ2. FIG. 5C exhibits a waveform of the reset pulse ΦR applied to the first reset gate electrode 21. FIG. 5D exhibits a waveform of a reset pulse ΦR' applied to the second reset gate electrode 22 via the resistance R101. FIG. 5E exhibits a waveform of a signal voltage outputted from the output node Vout.

Referring to FIGS. 5A to 5E, the first clock Φ1 becomes the low level and the second clock Φ2 becomes the high level at time t21. At time t22, the first clock Φ1 is brought into the high level, and the second clock Φ2 is brought into the low level. At this time, the reset pulse ΦR maintains the low level. At time t23, the reset pulse ΦR is inverted from the low level to the high level. At this time, the first clock Φ1 and the second clock Φ2 are also inverted. The reset pulse ΦR maintains the high level from time t23 through time t24 up to time t25.

As mentioned above, the resistance R101 is interposed between the second reset gate electrode 22 and a node N01. Therefore, waveform dullness caused by an RC delay due to the resistance R101 and a gate capacity is observed in a pulse waveform of the delay reset pulse ΦR' supplied to the second reset gate electrode 22. At time t24, the delay reset ΦR' is brought into the high level. The delay reset pulse ΦR' is shifted from the low level to the high level in a period from time t23 to time t24. At time t25, the reset pulse ΦR is inverted from the high level to the low level. Furthermore, at time t26, the delay reset pulse ΦR' is brought into the low level. Here, each of the elements is brought into a state similar to that of time t21.

FIGS. 6A to 6F are views showing charges and potentials of the CCD image sensor 23. Referring to FIGS. 6A to 6F, at time t21, the signal charges es1 are accumulated in the storage electrode of the second transfer electrode due to the output gate electrode 14 which becomes a barrier. At this time, the reset pulse ΦR becomes the low level, so that the reset gate electrode 20 existing between the floating diffusion 15 and the reset drain 17 becomes a potential barrier which separates both of the floating diffusion 15 and the reset drain 17.

At time t22, the first clock Φ1 and the second clock Φ2 are inverted. Therefore, the signal charges es2 are transferred form a transfer electrode (not shown) in the previous stage to the storage electrode of the first transfer electrode. The charges es1 accumulated in the storage electrode of the second transfer electrode are transferred to the floating diffusion 15. The floating diffusion 15 outputs a signal voltage to the output amplifier 18 in response to an amount of the charges.

At time t23, the reset pulse ΦR is brought into the high level. The reset pulse ΦR is directly applied to the first reset gate electrode 21 here. Accordingly, at time t23, the potential of the N type diffusion region under the first reset gate electrode 21 is made deeper than that of the floating diffusion 15. Next, at time t24, the potential of an N type diffusion region under the second reset gate electrode 22 is made deeper than that of the floating diffusion 15. Therefore, at time t24, a potential barrier between the floating diffusion 15 and the reset drain 17 is removed, so that charges in the floating diffusion 15 (charges es1+charges er1) are reset to the reset drain 17.

Next, at time t25, the reset pulse ΦR is brought into the low level. The potential of the N type diffusion region under the first reset gate electrode 21 rises in response to the reset pulse ΦR. The delay reset pulse ΦR' supplied to the second reset gate electrode 22 is delayed by an action of the resistance R101. The potential of the N type diffusion region under the second reset gate electrode 22 rises at time t26. At this time or in a time period between time t25 and time t26, the reset gate electrode 20 has a temporary reset gate potential which is stepwise and deeper toward the side of the reset drain 17. Accordingly, charges in the side of the second reset gate electrode 22 are entirely transferred to the reset drain 17, and the distributed charges er2 on the side of the first reset gate electrode 21 are exclusively distributed and transferred to the floating diffusion 15 and the reset drain 17. Therefore, if a gate length of the reset gate electrode 16 in the CCD image sensor 11 is equal to a gate length of the reset gate electrode 20 in the CCD image sensor 23, for example, an amount of the charges er distributed to the floating diffusion 15 are decreased in the reset gate electrode 20 by charges on the side of the second reset gate electrode 22.

FIG. 7 is a waveform view showing comparison of output voltages of the output node Vout in the above-mentioned cases. A waveform 31 shown in a dotted line indicates an output voltage of the output node Vout in the CCD image sensor 11. A waveform 32 shown in a solid line also indicates an output voltage of the output node Vout in the CCD image sensor 23. It is assumed here that a noise amount of the CCD image sensor 11 is a voltage $\Delta V_{RF}1$, and a noise amount of the CCD image sensor 23 is a voltage $\Delta V_{RF}2$. Referring to FIG. 7, a reset noise in the CCD image sensor 23 is decreased more than that of the CCD image sensor 11.

In conjunction with the above-mentioned techniques, other techniques are disclosed. Japanese Patent 2578615 discloses a technique to form a three-stage concentration gradient in a channel region of a reset transistor in order to distribute charges within the channel region. Japanese Laid-Open Patent Application JP-A-Heisei 11-150685 (corresponding to U.S. Pat. No. 6,570,618B1) discloses a technique to change operation timing of a reset pulse applied to two reset gates. Japanese Laid-Open Patent Application JP2005-317993 discloses a technique to configure a stepwise potential which is made deeper toward a floating diffusion side in a reset gate having two electrodes in order to change charge detection sensitivity.

I have now discovered that the facts which will be described below. In the disclosed CCD image sensor 11, the reset noise charge er2 is distributed to the floating diffusion 15 as mentioned above. Therefore, a charge amount which can be accumulated in the floating diffusion 15 or an accumulation amount of the es is occasionally decreased due to the reset noise charge er2 in the disclosed CCD image sensor 11. Amplitude of a signal voltage is also increased by the reset noise charge er2 in the disclosed CCD image sensor 11. Therefore, there are cases of decreasing a dynamic range of an amplifier circuit and causing S/N deterioration. Accordingly, the reset noise charge er2 causes a problem of deteriorating image quality of a read image in the disclosed CCD image sensor 11.

Furthermore, in the disclosed CCD image sensor 11, a waveform of a signal voltage outputted from the output node Vout settles in a level from the VRD to VF when the reset transistor is turned off. At this time, the disclosed CCD image sensor 11 requires prolonged time in a delay to distribute and transfer charges on the gate. Therefore, a period to maintain a $V_F1$ level or a stable level in a signal voltage becomes shorter by a charge transfer delay. In a signal output of the CCD, a signal level is captured by using the $V_F1$ level as a reference level. Therefore, if a period to maintain the $V_F1$ level or a stable level becomes short, it causes reduction of an operation speed of the CCD.

In order to decrease a reset noise, there is known the CCD image sensor 23 as shown in FIG. 4. The CCD image sensor 23 is provided with a resistance in wiring connected to the second reset gate electrode 22 of the reset gate electrode 20. Accordingly, a period of reset time itself is extended in the reset gate electrode 20 due to pulse deterioration caused by the RC delay. A period before settling in a $V_F2$ level is also extended by a delay period in the CCD image sensor 23. Therefore, there is a problem of decreasing an operation speed even if a reset noise level can be decreased.

SUMMARY

The present invention seeks to solve one or more of the above problems, or to improve upon those problems. In one embodiment, an image sensor includes a reset transistor configured to include a reset gate and a reset drain, and reset charges detected by a charge detection device; reset gate electrodes configured to control a potential of said reset gate; and a potential shift circuit configured to initialize output signals in response to a shift pulse, and output said output signals to said reset gate electrodes in response to a reset pulse.

In the device thus constructed, the output signals can be preliminary initialized to desired signals. Since the desired output signals are used to control the potential of the reset gate, the desired potential of the reset gate can be obtained at appropriate timing in the reset process of the image sensor.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 9A to 9E are timing charts showing an example of an operation of the CCD image sensor according to the first embodiment;

FIGS. 10A to 10D are views showing charges and potentials of a charge transfer in the CCD image sensor according to the first embodiment;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

An image sensor according to a first embodiment of the present invention will be described below with reference to the attached drawings.

Figure 8:
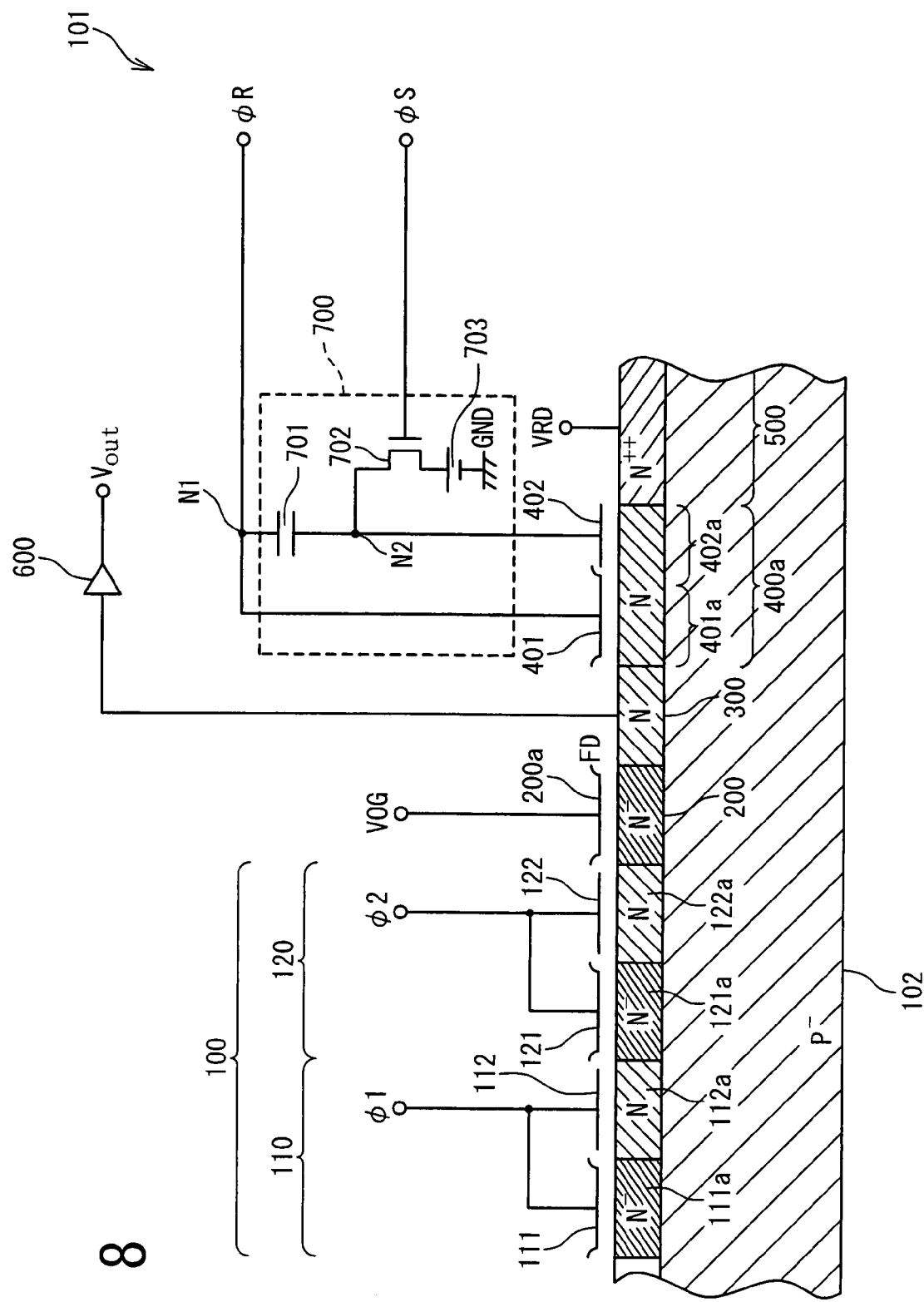
FIG. 8 is a sectional view showing an example of a constitution of a CCD image sensor according to a first embodiment of the present invention.

FIG. 8 is a sectional view showing an example of a constitution of a CCD image sensor 101 according to the first embodiment of the present invention. The CCD image sensor 101 in this embodiment includes a substrate 102, a first diffusion layer region 100, an second diffusion layer region 200, a floating diffusion 300, a third diffusion layer region 400a, a fourth diffusion layer region 500, an output amplifier 600, and a potential shift circuit 700.

Here, the first diffusion layer region 100 includes diffusion layers for CCD register transfer electrode portions. The second diffusion layer region 200 includes a diffusion layer for an output gate portion. The third diffusion layer region 400a includes a diffusion layer for a reset gate electrode portion. The fourth diffusion layer region 500 includes a diffusion layer for a reset drain portion.

The first diffusion layer region 100 transfers charges supplied from light receiving elements (not shown) to the floating diffusion 300. The second diffusion layer region 200 is interposed between the first diffusion layer region 100 and the floating diffusion 300 as shown in FIG. 8. The second diffusion layer region 200 supplies the charges transferred from the first diffusion layer region 100 to the floating diffusion 300 at a predetermined timing. The floating diffusion 300 converts the charges supplied via second diffusion layer region 200 into a signal voltage. As shown in FIG. 8, the floating diffusion 300 is connected to the output amplifier 600. The output amplifier 600 amplifies the voltage outputted from the floating diffusion 300 and outputs the amplified voltage via an output node Vout. The CCD image sensor 101 includes a reset transistor, which uses the floating diffusion 300 as a source, an electrode in an upper layer of the third diffusion layer region 400a as a gate electrode, and the fourth diffusion layer region 500 as a drain. The reset transistor resets a potential of the floating diffusion 300 to a potential of the fourth diffusion layer region 500 at a predetermined timing.

Referring to FIG. 8, the first diffusion layer region 100 includes a CCD first electrode 110 operated in response to a first clock $\Phi 1$, and a CCD second electrode 120 operated in response to a second clock $\Phi 2$. The CCD first electrode 110 includes a CCD first barrier electrode 111 and a CCD first storage electrode 112. As shown in FIG. 8, in a lower layer of the CCD first barrier electrode 111, the first diffusion layer region 100 includes a first-barrier-electrode diffusion layer region 111a formed by an N− type diffusion region. Also, in a lower layer of the CCD first storage electrode 112, the first diffusion layer region 100 includes a first-storage-electrode diffusion layer region 112a formed by an N-type diffusion region. Therefore, if a potential is compared between the first-barrier-electrode diffusion layer region 111a and the first-storage-electrode diffusion layer region 112a that are fluctuated by corresponding to the first clock $\Phi 1$, a deeper potential is obtained in the first-storage-electrode diffusion layer region 112a.

Similarly, the CCD second electrode 120 includes a CCD second barrier electrode 121 and a CCD second storage electrode 122. In a lower layer of the CCD second barrier electrode 121, the first diffusion layer region 100 includes a second-barrier-electrode diffusion layer region 121a formed by an N− type diffusion region. In a lower layer of the CCD second storage electrode 122, the first diffusion layer region 100 includes a second-storage-electrode diffusion layer region 122a formed by the N− type diffusion region. Accordingly, if a potential is compared between the second-barrier-electrode diffusion layer region 121a and the second-storage-electrode diffusion layer region 122a that are fluctuated by corresponding to the second clock $\Phi 2$, a deeper potential is obtained in the second-storage-electrode diffusion layer region 122a.

Moreover, referring to FIG. 8, an output gate voltage VOG is applied to an output gate electrode 200a for controlling a potential of the second diffusion layer region 200. A reset gate electrode includes a first reset gate electrode 401 and a second reset gate electrode 402. As shown in FIG. 8, the first reset gate electrode 401 is connected to a first node N1. The second reset gate electrode 402 is connected to the first node N1 via the potential shift circuit 700. The first node N1 may be included in the potential shift circuit 700.

The potential shift circuit 700 supplies a potential to the second reset gate electrode 402 such that the supplied potential makes a potential of a diffusion region in a lower layer of the second reset gate electrode 402 (referred to as a second-reset-portion diffusion layer region 402a hereinafter) deeper than a potential of a diffusion region in a lower layer of the first reset gate electrode 401 (referred to as a first-reset-portion diffusion layer region 401a hereinafter). Referring to FIG. 8, a reset pulse $\Phi R$ is supplied to the potential shift circuit 700 via the first node N1. The potential shift circuit 700 includes a capacitor 701, a switch 702, and a shift power supply 703. In this embodiment, the present invention will be explained by exemplifying a case that the switch 702 is an N-channel MOS transistor. However, it does not mean that the switch 702 of the potential shift circuit 700 in the present invention is limited to an N-channel MOS transistor.

Referring to FIG. 8, the capacitor 701 is interposed between the first node N1 and the second reset gate electrode 402. The capacitor 701 is connected to the first node N1 in one end, and connected to the second reset gate electrode 402 in the other end via a second node N2. A drain of the switch 702 is connected to the second node N2, and a source thereof is connected to the shift power supply 703. A shift pulse $\Phi S$ is supplied to a gate of the switch 702. The shift power supply 703 has a ground node and a power supply node. The ground node of the shift power supply 703 is connected to a ground line, and the power supply node thereof is connected to the source of the switch 702.

In this embodiment, the capacitor 701 removes a DC component of the reset pulse $\Phi R$. The switch 702 is also turned on in response to the shift pulse $\Phi S$, such that a potential equal to that of the shift power supply 703 is charged to the capacitor 701. Then, the shift power supply 703 provides a potential V1. The potential V1 is a potential which makes a potential of the second-reset-portion diffusion layer region 402a deeper than a potential of the first-reset-portion diffusion layer region 401a. In other words, a constant positive potential with respect to the first reset gate electrode 401 is supplied to the second reset gate electrode 402 by the potential shift circuit 700. Furthermore, the reset pulse $\Phi R$ is applied to the first reset gate electrode 401 and the second reset gate electrode 402 via the first node N1. Accordingly, a level of the reset pulse $\Phi R$ is supplied to the first reset gate electrode 401, while a potential shifted by the voltage V1 with respect to a level of the reset pulse $\Phi R$ is supplied to the reset gate electrode 402.

An operation of the CCD image sensor 101 in this embodiment will be explained below referring to drawings. FIGS. 9A to 9E are timing charts showing an example of an operation of the CCD image sensor 101 in this embodiment. FIG. 9A exhibits an operation waveform of the shift pulse $\Phi S$. FIG. 9B exhibits an operation waveform of the first clock $\Phi 1$. FIG. 9C exhibits an operation waveform of the second clock $\Phi 2$. FIG. 9D exhibits an operation waveform of the reset pulse $\Phi R$. FIG. 9E exhibits an operation waveform of an output voltage outputted from the output node Vout.

Referring to FIGS. 9A to 9E, the shift pulse $\Phi S$ is activated in a suspension period of the first clock $\Phi 1$ and the second clock $\Phi 2$. Activation of the shift pulse $\Phi S$ makes the switch 702 be turned on, and the capacitor 701 is charged. The potential of the second reset gate electrode 402 is made deeper than that of the first reset gate electrode 401 by a potential corresponding to charges accumulated in the capacitor 701 or the voltage V1. Therefore, a potential of the third diffusion layer region 400a is made stepwise and deeper toward the side of fourth diffusion layer region 500. In other words, the potential of the third diffusion layer region 400a is initialized. It may be considered that since the capacitor 701 is charged, the potential shift circuit 700 can modify or initialize the reset pulse ΦR. Then, since the modified or initialized reset pulses ΦR are respectively outputted to the first reset gate electrode 401 and the second reset gate electrode 402, the potential of the third diffusion layer region 400a is made stepwise and deeper toward the side of fourth diffusion layer region 500.

The first clock Φ1 of the low level and the second clock Φ2 of the high level are supplied at time t01. At this time, the reset pulse ΦR of the low level is supplied. At time t02, the first clock Φ1 is inverted to the high level, and the second clock Φ2 is similarly inverted to the low level. At this time, the reset pulse ΦR maintains the low level.

At time t03, the reset pulse ΦR is brought into the high level. The first clock Φ1 and the second clock Φ2 are also inverted at this timing. Accordingly, the first clock Φ1 of the low level and the second clock Φ2 of the high level are supplied. At time t04, the reset pulse ΦR is shifted from the high level to the low level. At this time, the first clock Φ1 and the second clock Φ2 maintains respective levels obtained at time t04.

An operation of the CCD image sensor 101 will be explained below when each of the clocks is supplied at the above-mentioned timing, referring to drawings. FIGS. 10A to 10D are views showing charges and potentials of a charge transfer in the CCD image sensor 101. Referring to FIGS. 10A to 10D, first signal charges es1 are accumulated in the second-storage-electrode diffusion layer region 122a at time t01 due to the second diffusion layer region 200 which becomes a barrier. The reset pulse ΦR is the low level at time t01. Therefore, the third diffusion layer region 400a is interposed between the floating diffusion 300 and the fourth diffusion layer region 500, and acts as a potential barrier to separate both of the floating diffusion 300 and the fourth diffusion layer region 500. First error charges er1 are accumulated in the floating diffusion 300 at this time.

At time t02, the first clock Φ1 and the second clock Φ2 are inverted. Therefore, second signal charges es2 obtained from a transfer electrode (not shown) in the previous stage are transferred to the first-storage-electrode diffusion layer region 112a. At time t02, the first signal charges es1 in the second-storage-electrode diffusion layer region 122a are also transferred to the floating diffusion 300. The floating diffusion 300 converts charges integrated by the first signal charges es1 and the first error charges er1 which were already accumulated therein into a signal voltage, and outputs the signal voltage to the output amplifier 600.

At time t03, the reset pulse ΦR is brought into the high level. The potential of the third diffusion layer region 400a is made deeper than the potential of the fourth diffusion layer region 500 to which a voltage VRD is applied, in response to the reset pulse ΦR in the high level. Accordingly, the potential barrier between the floating diffusion 300 and the fourth diffusion layer region 500 is removed, so that the charges of the floating diffusion 300 is reset to the fourth diffusion layer region 500.

At time t04, the reset pulse ΦR is brought into the low level. The third diffusion layer region 400a is turned off in response to the reset pulse ΦR in the low level. When the potential of the first-reset-portion diffusion layer region 401a is compared with the potential of the second-reset-portion diffusion layer region 402a, the potential of the second-reset-portion diffusion layer region 402a is made deeper toward the side of the fourth diffusion layer region 500. Therefore, the charges in the second-reset-portion diffusion layer region 402a are almost transferred to the side of the fourth diffusion layer region 500. Accordingly, in the CCD image sensor 101 in this embodiment, the charges in the first-reset-portion diffusion layer region 401a are distributed and transferred to both the fourth diffusion layer region 500 and the floating diffusion 300. Therefore, the floating diffusion 300 is supposed to accumulate the second error charges er2 distributed from the first-reset-portion diffusion layer region 401a.

Figure 1:
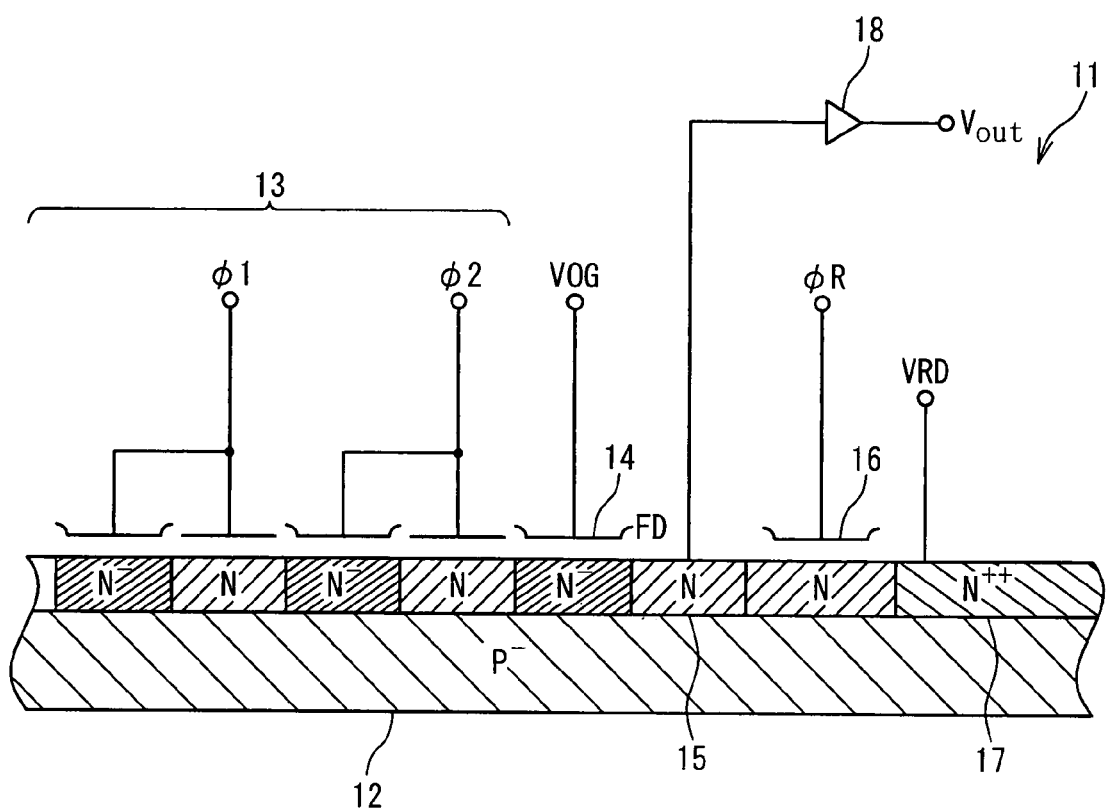
FIG. 1 is a sectional view showing a constitution of a disclosed CCD image sensor.
Figure 2:
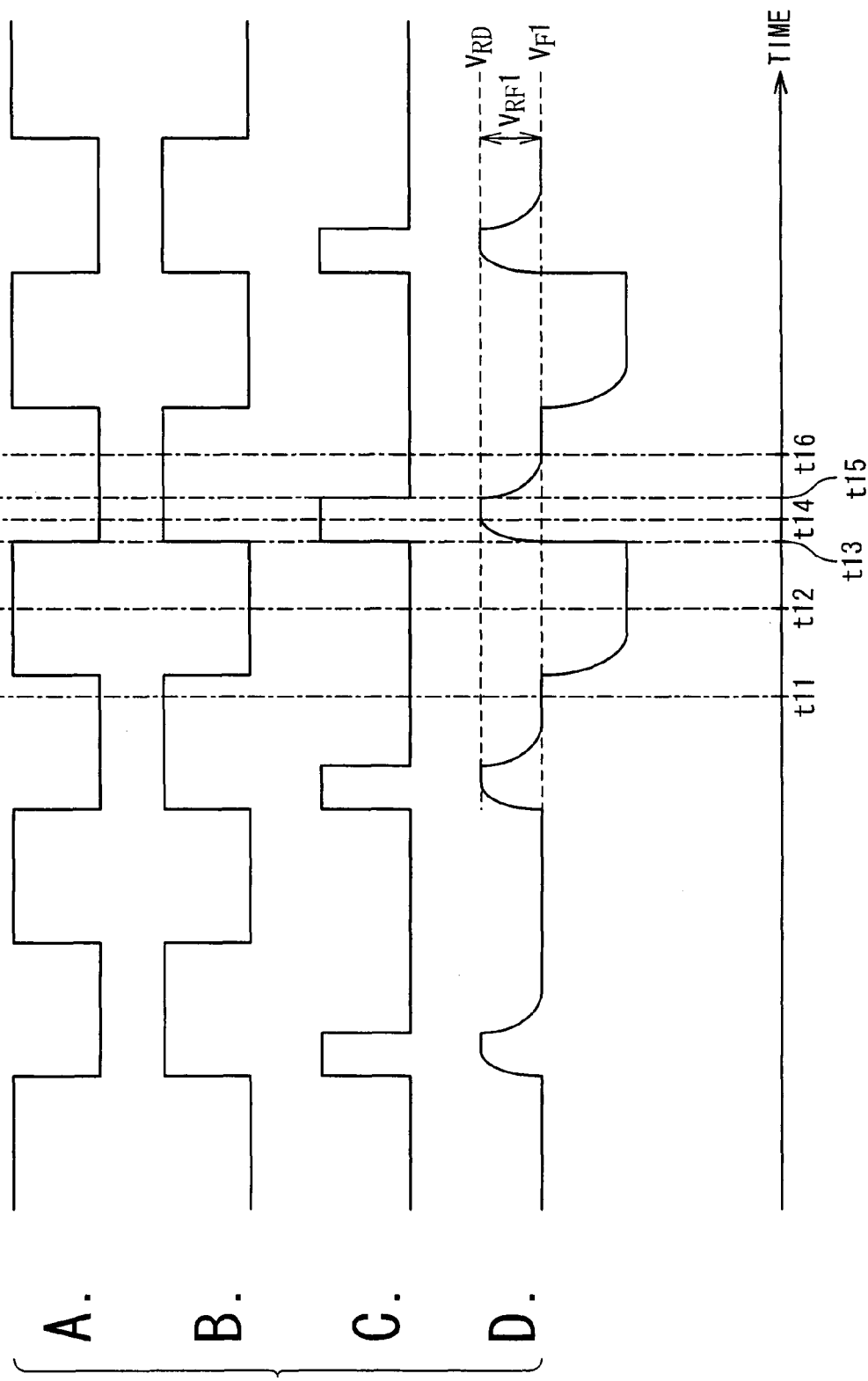
FIGS. 2A to 2D are timing charts showing an operation of the disclosed CCD image sensor.
Figure 3:
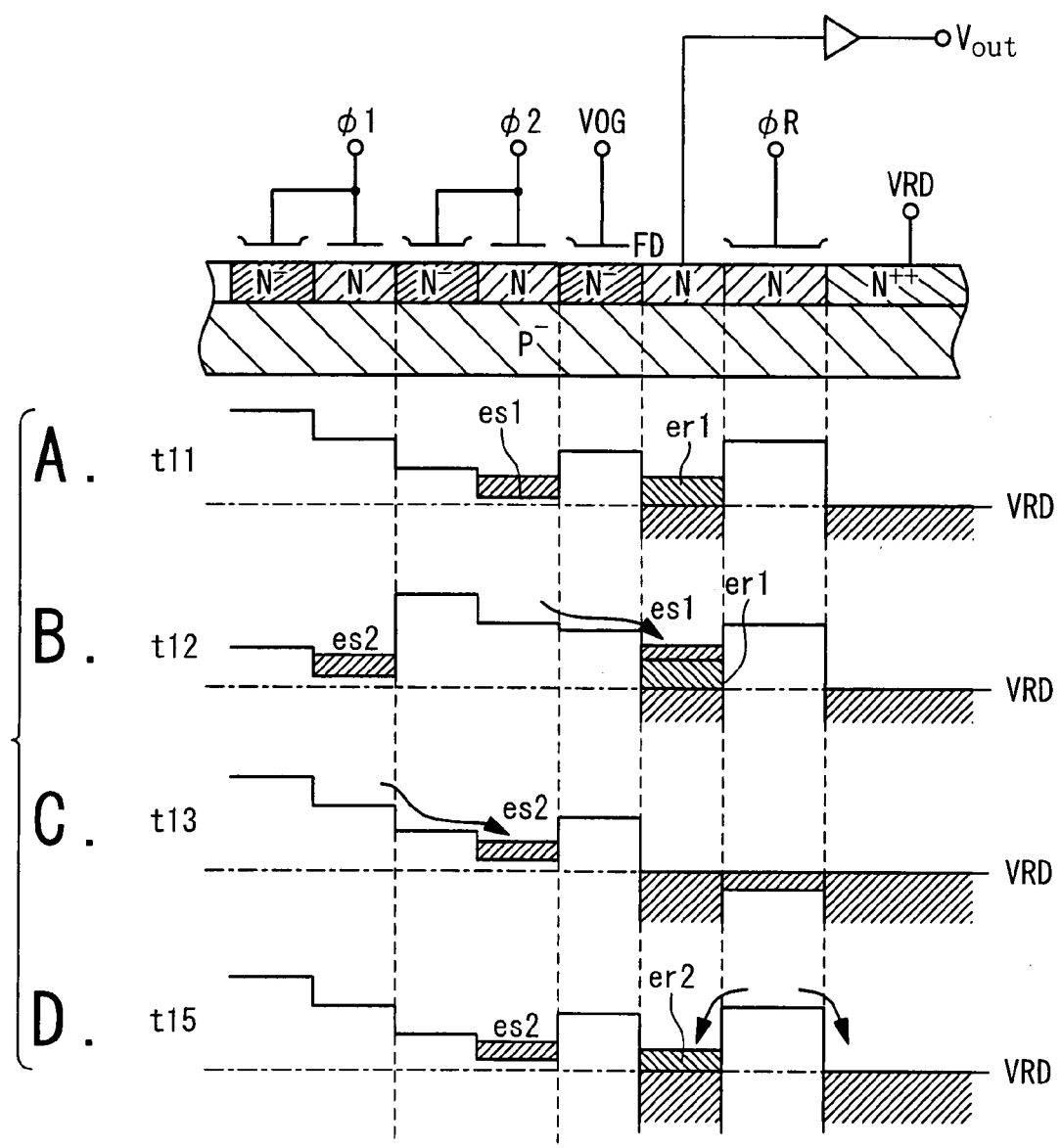
FIGS. 3A to 3D are views showing changes and potentials in the disclosed CCD image sensor.
Figure 4:
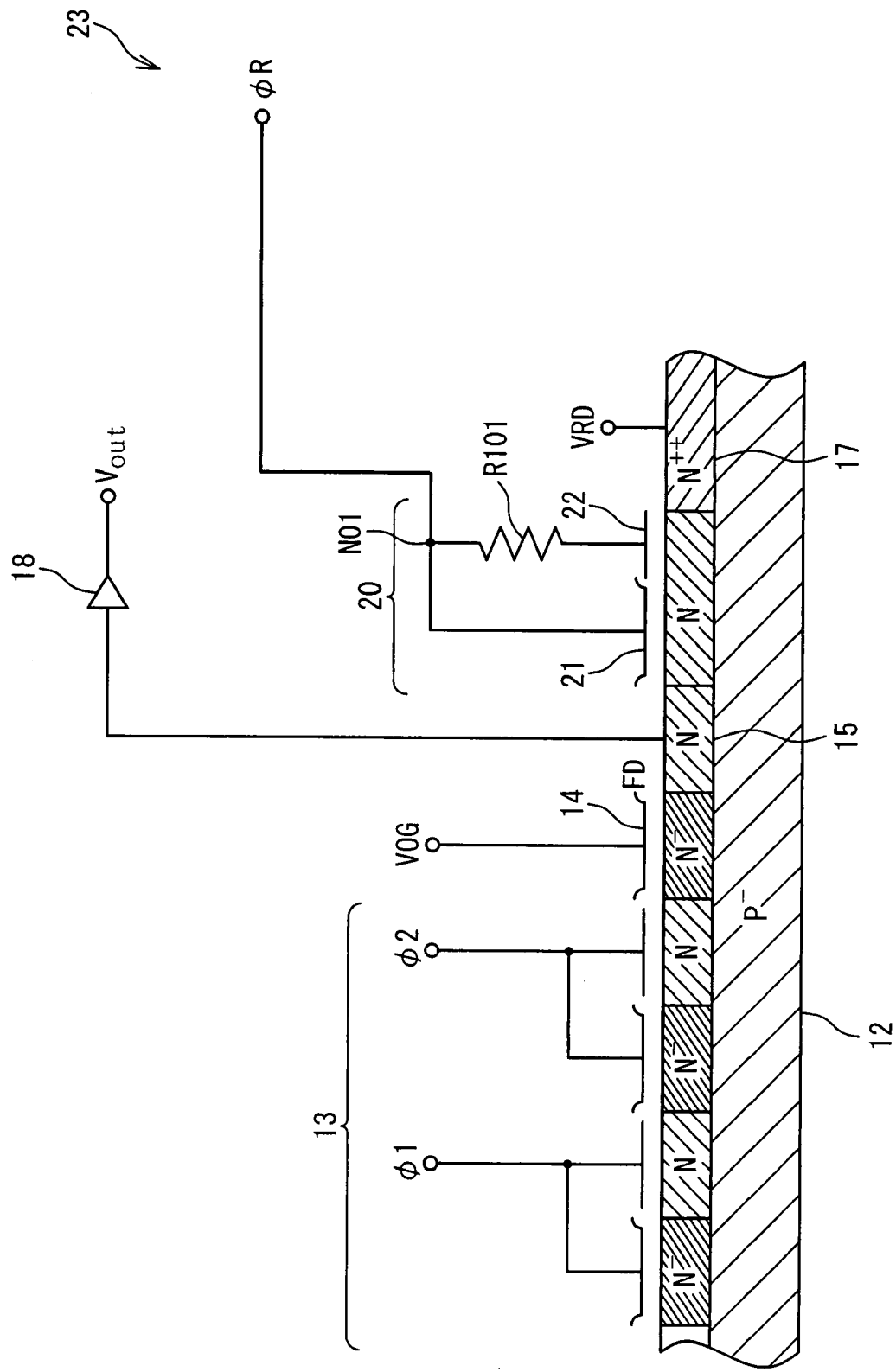
FIG. 4 is a sectional view showing a constitution of a disclosed CCD image sensor.
Figure 5:
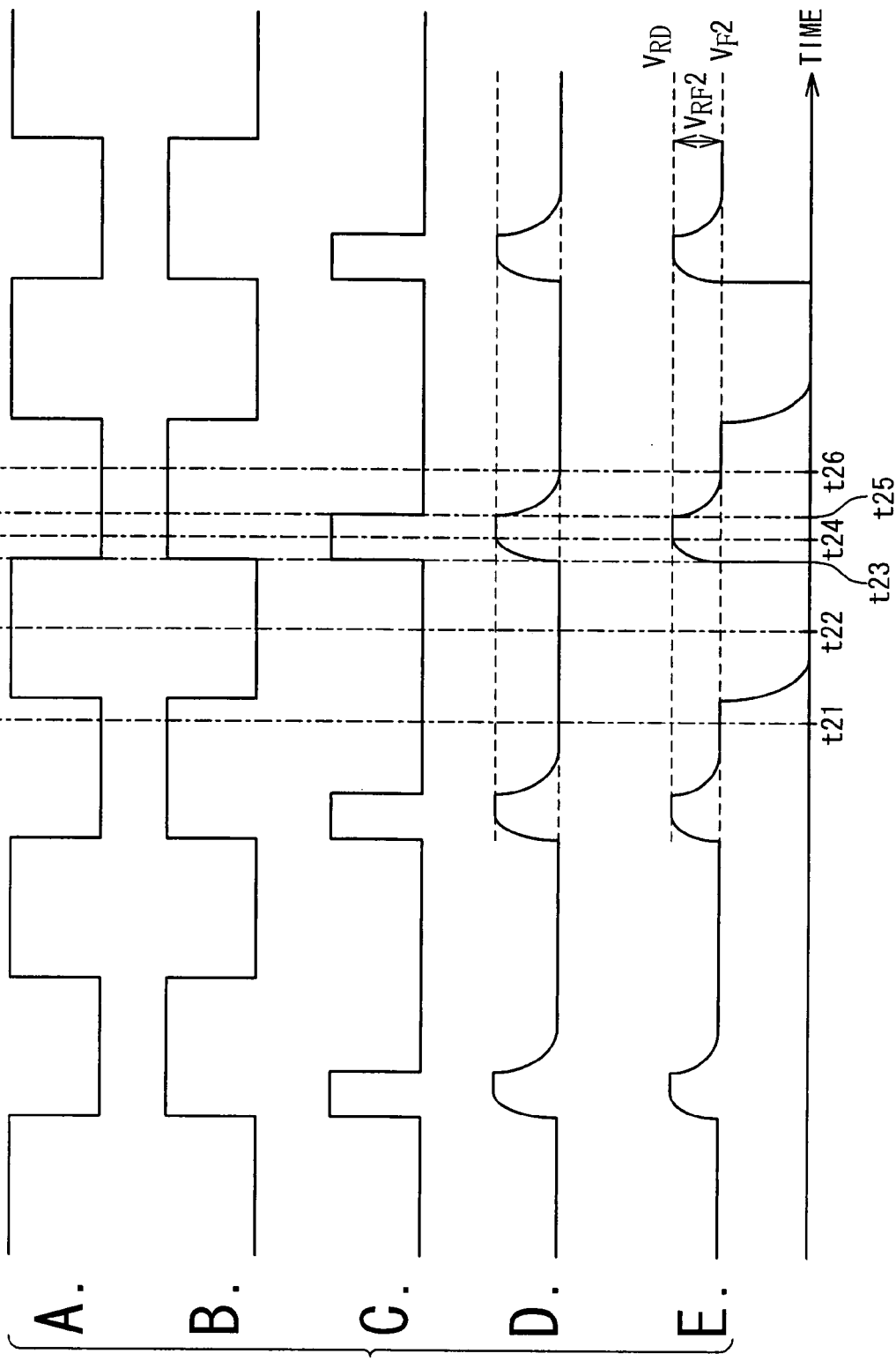
FIGS. 5A to 5E are timing charts showing an operation of the CCD image sensor.
Figure 6:
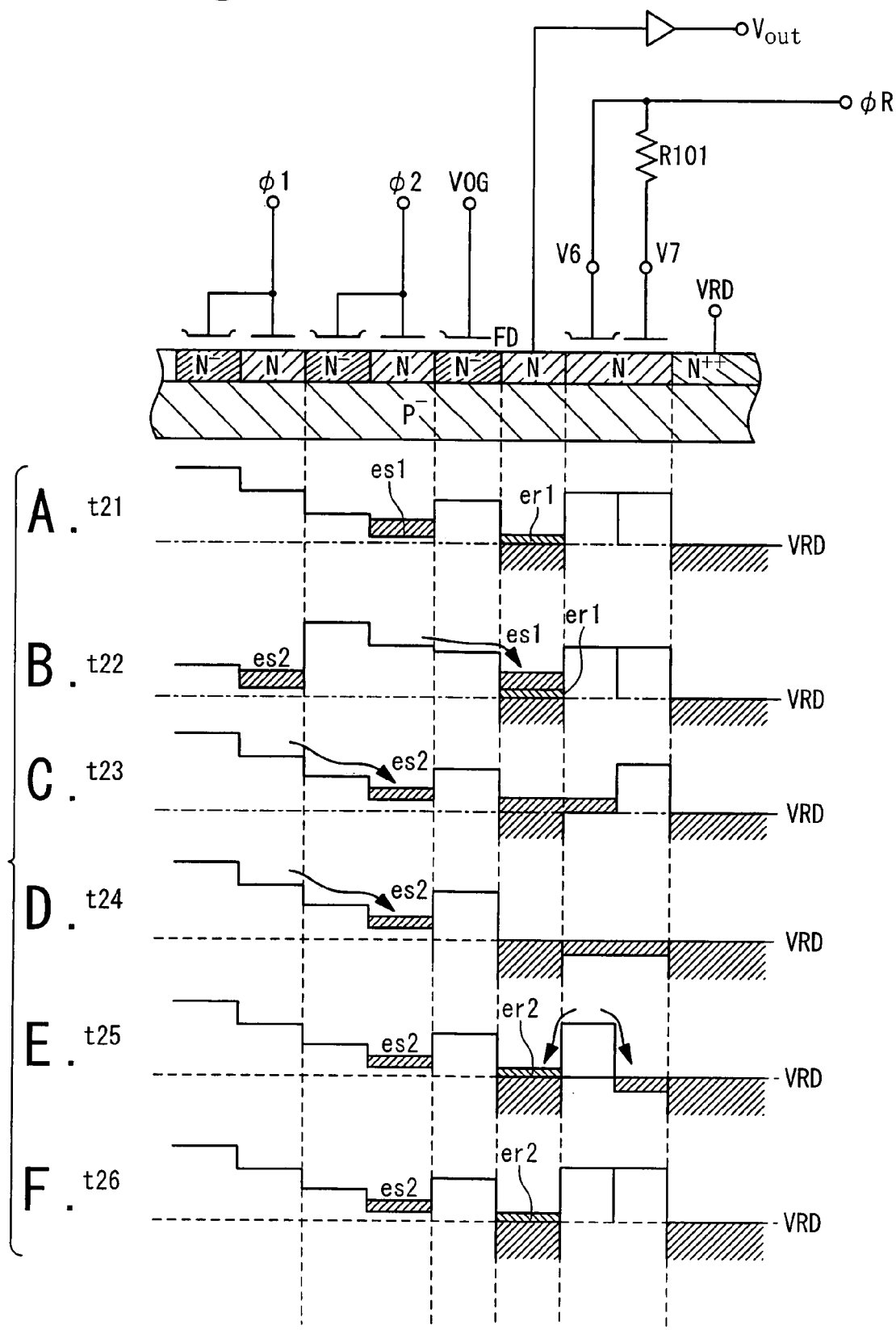
FIGS. 6A to 6F are views showing charges and potentials of the CCD image sensor.
Figure 7:
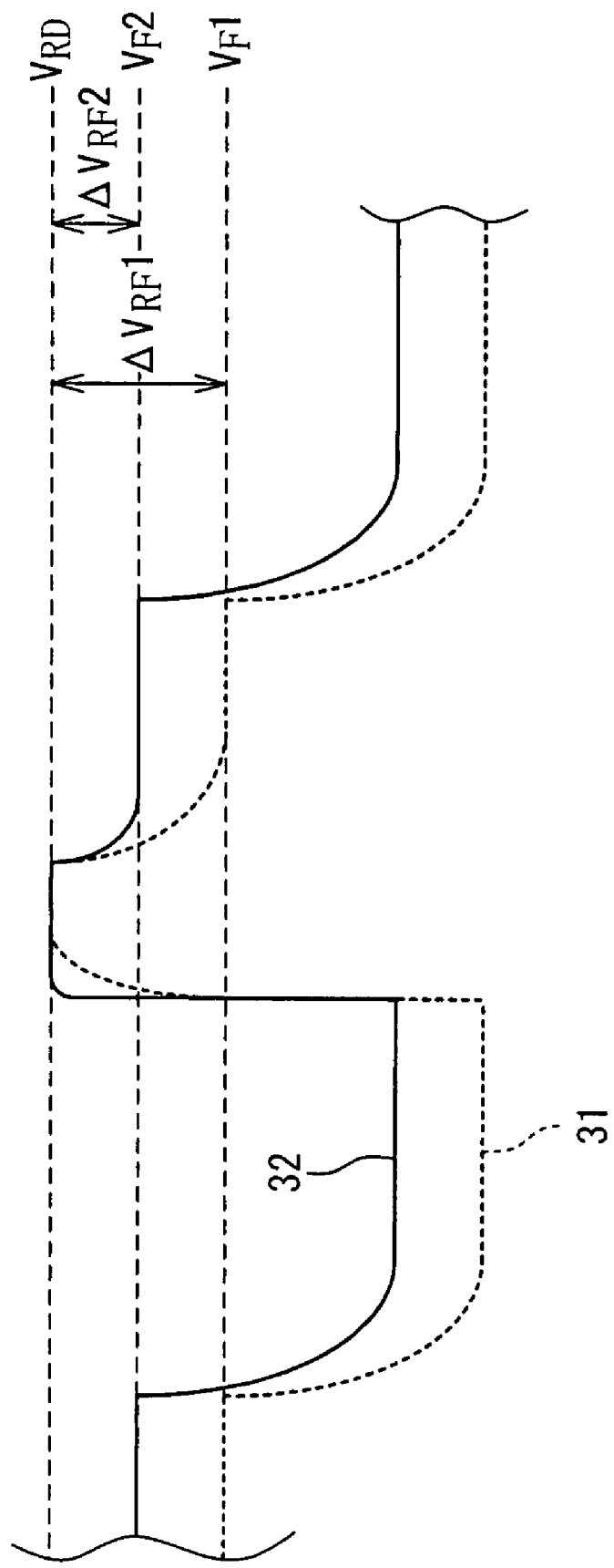
FIG. 7 is a waveform view showing comparison of output voltages of an output node Vout in the disclosed CCD image sensor.
Figure 11:
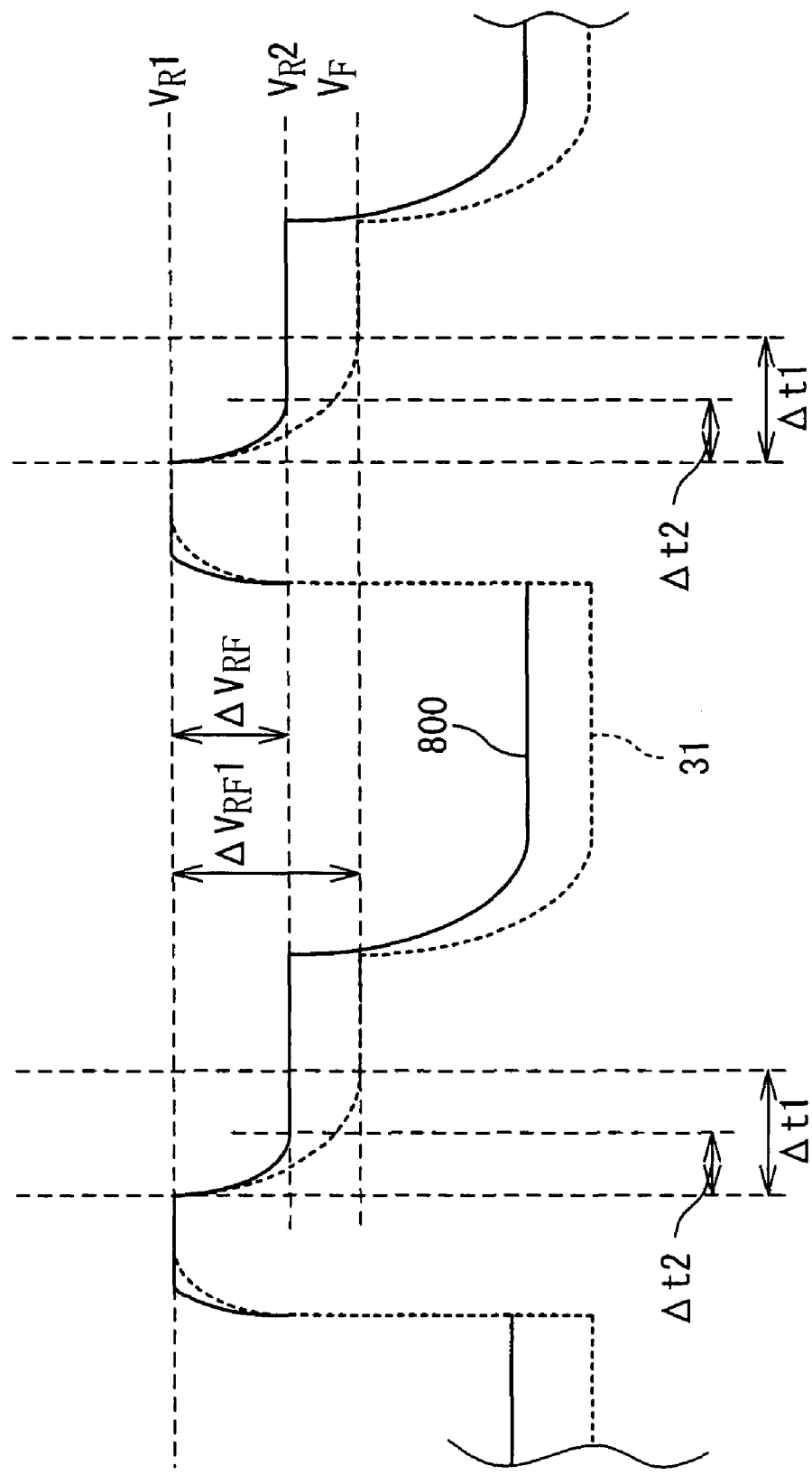
FIG. 11 is a waveform view showing an output voltage from the output node Vout in the CCD image sensor according to the first embodiment.

An output voltage of the CCD image sensor 101 in this embodiment will be explained below referring to drawings. FIG. 11 is a waveform view showing output voltages from the output node Vout in the CCD image sensor 101 according to this embodiment and from the output node Vout in the disclosed CCD image sensor 11. In FIG. 11, a waveform 800 indicates an output voltage from the output node Vout in the CCD image sensor 101 in this embodiment. A waveform 31 indicates an output voltage from the output node Vout in the disclosed image sensor 11 shown in FIG. 7 for comparison. Each of the waveforms shown in FIG. 11 is exemplified in a case where a combined length of a gate length of the first reset gate electrode 401 and a gate length of the second reset gate electrode 402 is equal to a reset gate length of the disclosed CCD image sensor 11.

As mentioned above, the charges er distributed from the third diffusion layer region 400a to the floating diffusion 300 is decreased by charges of the second-reset-portion diffusion layer region 402a in the CCD image sensor 101 in this embodiment. Referring to FIG. 11, it is shown that a voltage $\Delta V_{RF}$ as a reset noise in this case is made smaller than a voltage $\Delta V_{RF}1$ as a reset noise in the case using the disclosed CCD image sensor 11. Therefore, the CCD image sensor 101 in this embodiment allows improvement of image quality in a read image by decreasing the reset noise.

The CCD image sensor 101 in this embodiment includes the first reset gate electrode 401 with a shorter reset gate length than a reset gate length of the disclosed CCD image sensor 11 or the CCD image sensor 23. A period of time to transfer the second error charges er2 from the third diffusion layer region 400a to the floating diffusion 300 is changed on the basis of a gate length of the first reset gate electrode 401 of the third diffusion layer region 400a. Time Δt1 in FIG. 11 indicates time to transfer the distributed charges er in the disclosed CCD image sensor 11. Time Δt2 in FIG. 11 indicates time to transfer the distributed charges er including the first error charges er1 or the second error charges er2 in this embodiment. Referring to FIG. 11, it is shown that time Δt2 in this embodiment is shorter than the time Δt1 in the disclosed CCD image sensor 11. Accordingly, a reset noise level and a delay time of the noise can be decreased by preparing the first reset gate electrode 401 in this embodiment to be shorter than a reset gate length of the disclosed CCD image sensor 11 or CCD image sensor 23.

Moreover, the CCD image sensor 101 in this embodiment controls a potential without connecting a resistance to the second reset gate electrode 402 in series, as mentioned above. Therefore, a signal voltage can be outputted without having a reset speed delay and a charge transfer delay due to an RC delay to be observed in the disclosed CCD image sensor 23.

In the CCD image sensor, a device in which the reset drain voltage VRD applied to the fourth diffusion layer region 500 is about 10 V has been widely disseminated. In this case, if the reset pulse ΦR is about 5 V in the high level, it is occasionally impossible to perform an appropriate reset operation. In order to execute a reset operation appropriately, an amplitude level of the reset pulse ΦR is set to be 10 V or larger by an internal driver or the like in the CCD image sensor. The reset pulse ΦR in the CCD image sensor 101 in the first embodiment is preferably set to have an amplitude level which is equal to or larger than the reset drain voltage VRD by an internal driver (not shown) of the device as mentioned above.

Second Embodiment

An image sensor according to a second embodiment of the present invention will be described below with reference to the attached drawings. In the second embodiment, an element having a reference letter same as that in the first embodiment is configured and operated in the same manner as the element of the first embodiment. Accordingly, explanations of the duplicated elements will be omitted.

Figure 12:
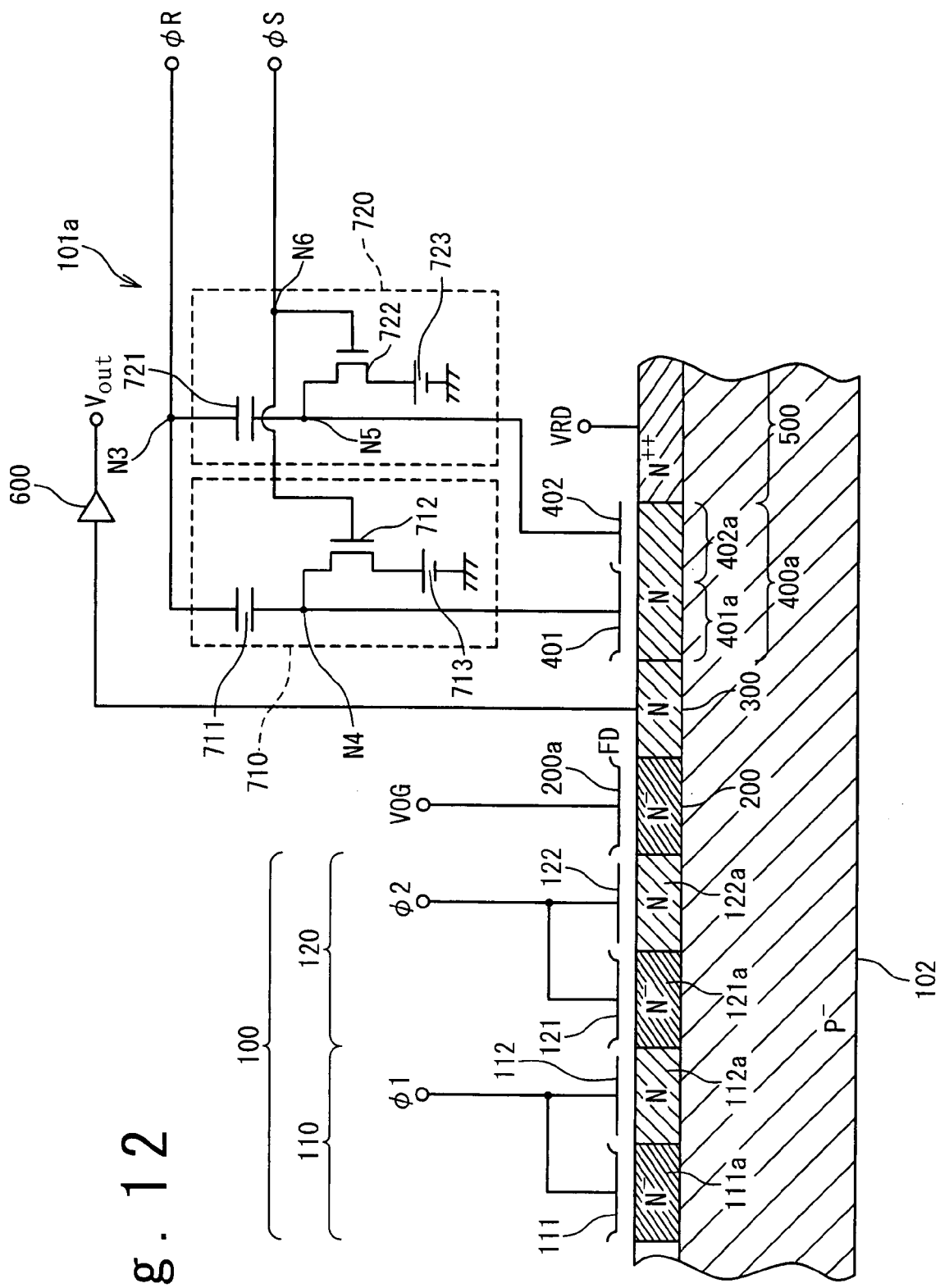
FIG. 12 is a sectional view showing an example of a constitution of a CCD image sensor according to a second embodiment.
Figure 13:
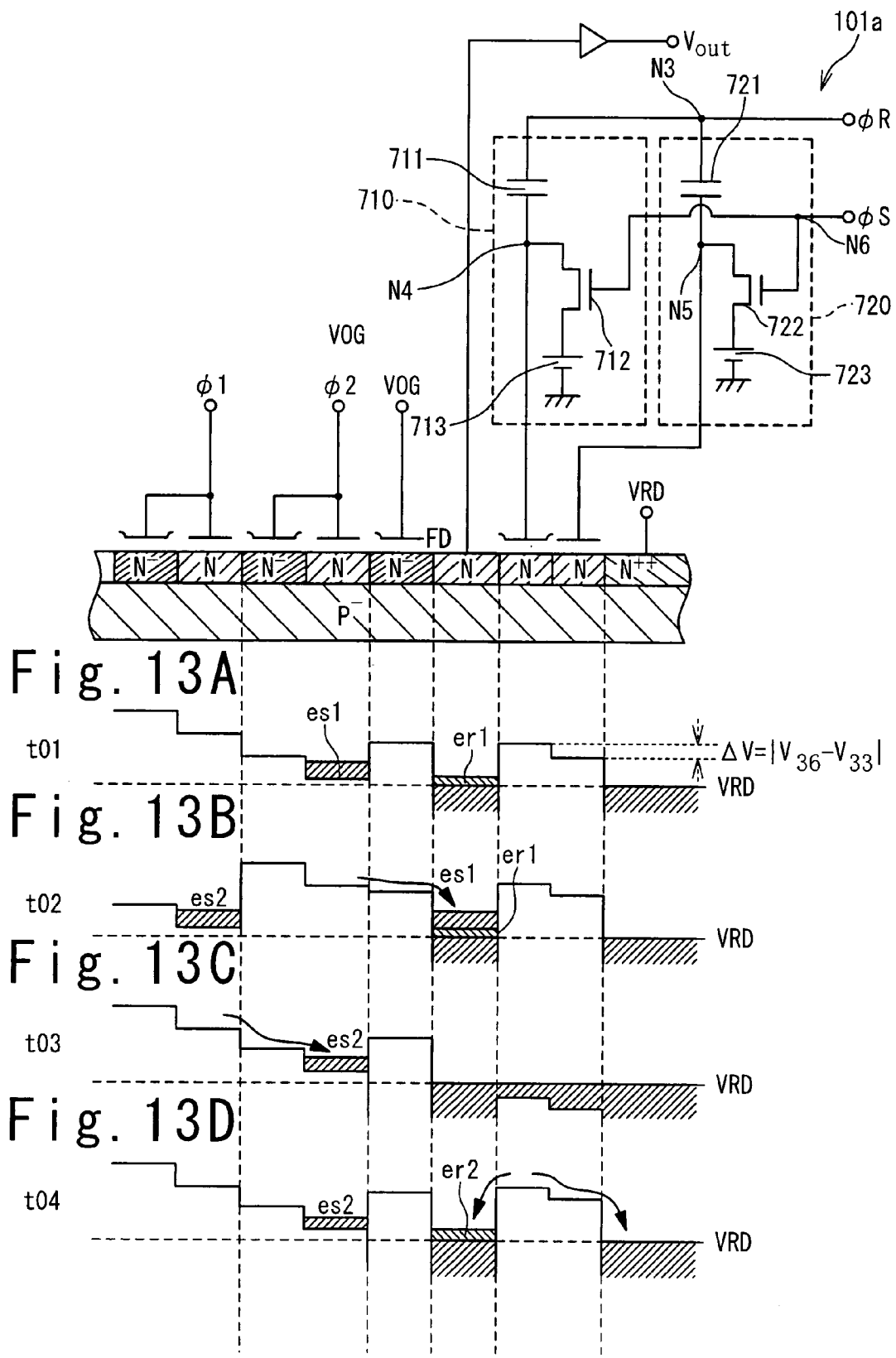
FIGS. 13A to 13D are views showing charges and potentials of a charge transfer in the CCD image sensor in the second embodiment.

FIG. 12 is a sectional view showing an example of a constitution of a CCD image sensor 101a according to the second embodiment of the present invention. The CCD image sensor 101a in the second embodiment is provided with a first potential shift circuit 710 interposed between a reset pulse supply node for supplying the reset pulse ΦR and the first reset gate electrode 401. The CCD image sensor 101a is also provided with a second potential shift circuit 720 interposed between the reset pulse supply node and the second reset gate electrode 402. The first potential shift circuit 710 and the second potential shift circuit 720 are configured in the same manner as the potential shift circuit 700 in the first embodiment.

Referring to FIG. 12, the first potential shift circuit 710 is interposed between a third node N3 and the first reset gate electrode 401. The second potential shift circuit 720 is interposed between the third node N3 and the second reset gate electrode 402. As shown in FIG. 12, the first potential shift circuit 710 includes a first capacitor 711, a first switch 712, and a first shift power supply 713. The second embodiment will be explained by exemplifying a case that the first switch 712 is an N-channel MOS transistor. However, it does not mean that the first switch 712 in the present invention is limited to an N-channel MOS transistor. Referring to FIG. 12, the first capacitor 711 is connected to the third node N3 in one end, and connected to the first reset gate electrode 401 in the other end via a fourth node N4. A drain of the first switch 712 is connected to the fourth node N4, and a source thereof is connected to the first shift power supply 713. The shift pulse ΦS is supplied to a gate of the first switch 712 via a sixth node N6. Furthermore, the first shift power supply 713 is provided with a ground node and a power supply node. The ground node of the first shift power supply 713 is connected to a ground line, and the power supply node thereof is connected to the source of the first switch 712. The third node N3 may be included in the first potential shift circuit 720.

Similarly, the second potential shift circuit 720 includes a second capacitor 721, a second switch 722, and a second shift power supply 723. Although the second embodiment will be explained by exemplifying a case that the second switch 722 is an N-channel MOS transistor, it does not mean that the second switch 722 is limited to an N-channel MOS transistor. Referring to FIG. 12, the second capacitor 721 is connected to the third node N3 in one end, and connected to the second reset gate electrode 402 in the other end via a fifth node N5. A drain of the second switch 722 is connected to the fifth node N5, and a source thereof is connected to the second shift power supply 723. The shift pulse ΦS is supplied to a gate of the second switch 722 via the sixth node N6. Furthermore, the second shift power supply 723 is provided with a ground node and a power supply node. The ground node of the second shift power supply 723 is connected to the ground line, and the power supply node thereof is connected to the source of the second switch 722. If it is assumed that a voltage provided by the first shift power supply 713 is a first voltage $V_{33}$ and a voltage provided by the second shift power supply 723 is a second voltage $V_{36}$, the first voltage $V_{33}$ is smaller than the second voltage $V_{36}$ in the second embodiment. That is, first voltage $V_{33}$<second voltage $V_{36}$.

It is preferable here that the first voltage $V_{33}$ and the second voltage $V_{36}$ are made by a power supply from the CCD image sensor 101a using a voltage dividing circuit or the like.

An operation of a charge transfer in the second embodiment will be explained below. FIGS. 13A to 13D are views showing charges and potentials of a charge transfer in the CCD image sensor in the second embodiment. It is assumed here that the shift pulse ΦS, the first clock Φ1, the second clock Φ2, and the reset pulse ΦR are supplied to the CCD image sensor 101a in the second embodiment at timing similar to that of the first embodiment. It is also assumed that potentials in FIGS. 13A to 13D has + in the lower direction. Referring to FIGS. 13A to 13D, if a potential at time t01 is compared between the first-reset-portion diffusion layer region 401a and the second-reset-portion diffusion layer region 402a in the second embodiment, the potential of the second-reset-portion diffusion layer region 402a is deeper than that of the first-reset-portion diffusion layer region 401a by a potential difference generated by a potential difference ΔV between the first reset gate electrode 401 and the second reset gate electrode 402.

In the CCD image sensor 101a in the present embodiment, the first switch 712 and the second switch 722 are turned on by activating the shift pulse ΦS in a suspension period of the first clock Φ1 and the second clock Φ2. The first capacitor 711 and the second capacitor 721 are charged by turning on the first switch 712 and the second switch 722. As mentioned above, the first voltage $V_{33}$ is smaller than the second voltage $V_{36}$. Therefore, the second reset gate electrode 402 has a potential which is made deeper than that of the first reset gate electrode 401 by a voltage ΔV corresponding to ΔV=|first voltage $V_{33}$−second voltage $V_{36}$|. Therefore, potential in the third diffusion layer region 400a is made stepwise and deeper toward the side of the fourth diffusion layer region 500. In other words, the potential of the third diffusion layer region 400a is initialized. It may be considered that since the first capacitor 711 and the second capacitor 721 are charged, the first and second potential shift circuits 710, 720 can modify or initialize the reset pulse ΦR. Then, since the modified or initialized reset pulses ΦR are respectively outputted to the first reset gate electrode 401 and the second reset gate electrode 402, the potential of the third diffusion layer region 400a is made stepwise and deeper toward the side of fourth diffusion layer region 500.

At time t01, the first signal charges es1 is accumulated in the second-storage-electrode diffusion layer region 122a due to the second diffusion layer region 200 which becomes the barrier. The reset pulse ΦR is the low level at time t01. Therefore, the third diffusion layer region 400a existing between the floating diffusion 300 and the fourth diffusion layer region 500 acts as a potential barrier which separates both of the floating diffusion 300 and the fourth diffusion layer region 500. At this time, the first error charges er1 are accumulated in the floating diffusion 300.

At time t02, the first clock Φ1 and the second clock Φ2 are inverted. Therefore, the second signal charges es2 obtained from a transfer electrode (not shown) in the previous stage are transferred to the first-storage-electrode diffusion layer region 112a. At time t02, the first signal charges es1 in the second-storage-electrode diffusion layer region 122a are transferred to the floating diffusion 300. The floating diffusion 300 converts charges integrated by the first signal charges es1 and the first error charges er1 which were already accumulated therein into a signal voltage in order to output to the output amplifier 600.

At time t03, the reset pulse ΦR is brought into the high level. Accordingly, the potential of the third diffusion layer region 400a is made deeper than the potential of the fourth diffusion layer region 500 to which the voltage VRD is applied, in response to the reset pulse ΦR in the high level in the same manner with the first embodiment. Therefore, a potential barrier between the floating diffusion 300 and the fourth diffusion layer region 500 is removed, so that charges in the floating diffusion 300 is reset to the fourth diffusion layer region 500.

Thereafter, the reset pulse ΦR is brought into the low level at time t04. The third diffusion layer region 400a is turned off in response to the reset pulse ΦR in the low level. As mentioned above, in the second embodiment, if the potential of the first-reset-portion diffusion layer region 401a is compared with the potential of the second-reset-portion diffusion layer region 402a, the potential of the second-reset-portion diffusion layer region 402a is made deeper toward the side of the fourth diffusion layer region 500 than that of the first-reset-portion diffusion layer region 401a. Therefore, the charges in the second-reset-portion diffusion layer region 402a is almost transferred to the side of the fourth diffusion layer region 500. In the CCD image sensor 101a in the second embodiment, the charges in the first-reset-portion diffusion layer region 401a is exclusively distributed and transferred to both of the fourth diffusion layer region 500 and the floating diffusion 300, in the same manner with the CCD image sensor 101 in the first embodiment. Accordingly, the floating diffusion 300 is supposed to accumulate the second error charges er2 distributed from the first-reset-portion diffusion layer region 401a.

In the CCD image sensor, a device in which the reset drain voltage VRD applied to the fourth diffusion layer region 500 is about 10 V has been widely disseminated. In this case, if the reset pulse ΦR is about 5 V in the high level, it is occasionally impossible to perform an appropriate reset operation. In order to execute a reset operation appropriately, an amplitude level of the reset pulse ΦR is set to be 10 V or larger by an internal driver or the like in the CCD image sensor. As mentioned above, the CCD image sensor 101a in the second embodiment is provided with the first potential shift circuit 710 having the first shift power supply 713, and the second potential shift circuit 720 having the second shift power supply 723. The first potential shift circuit 710 supplies a potential equal to that of the first shift power supply 713 to the first reset gate electrode 401. Similarly, the second potential shift circuit 720 supplies a potential equal to that of the second shift power supply 723 to the second reset gate electrode 402. Therefore, the first reset gate electrode 401 and the second reset gate electrode 402 are shifted to higher potentials than those obtained when the first potential shift circuit 710 and the second potential shift circuit 720 are not provided. In this case, if the voltage $V_{33}$ and the voltage $V_{36}$ are about 5V, the potentials of the first-reset-portion diffusion layer region 401a and the second-reset-portion diffusion layer region 402a can be made to be 10 V or larger even though an amplitude voltage is about 5 V in the reset pulse ΦR. Accordingly, in the CCD image sensor 101a in the second embodiment, a reset noise can be decreased without using an internal driver of the device or the like.

Third Embodiment

An image sensor according to a third embodiment of the present invention will be described below with reference to the attached drawings. In the third embodiment, an element having a reference letter same as that in the first or second embodiments is configured and operated in the same manner as the element of the first or second embodiment. Accordingly, explanations of the duplicated elements will be omitted.

Figure 14:
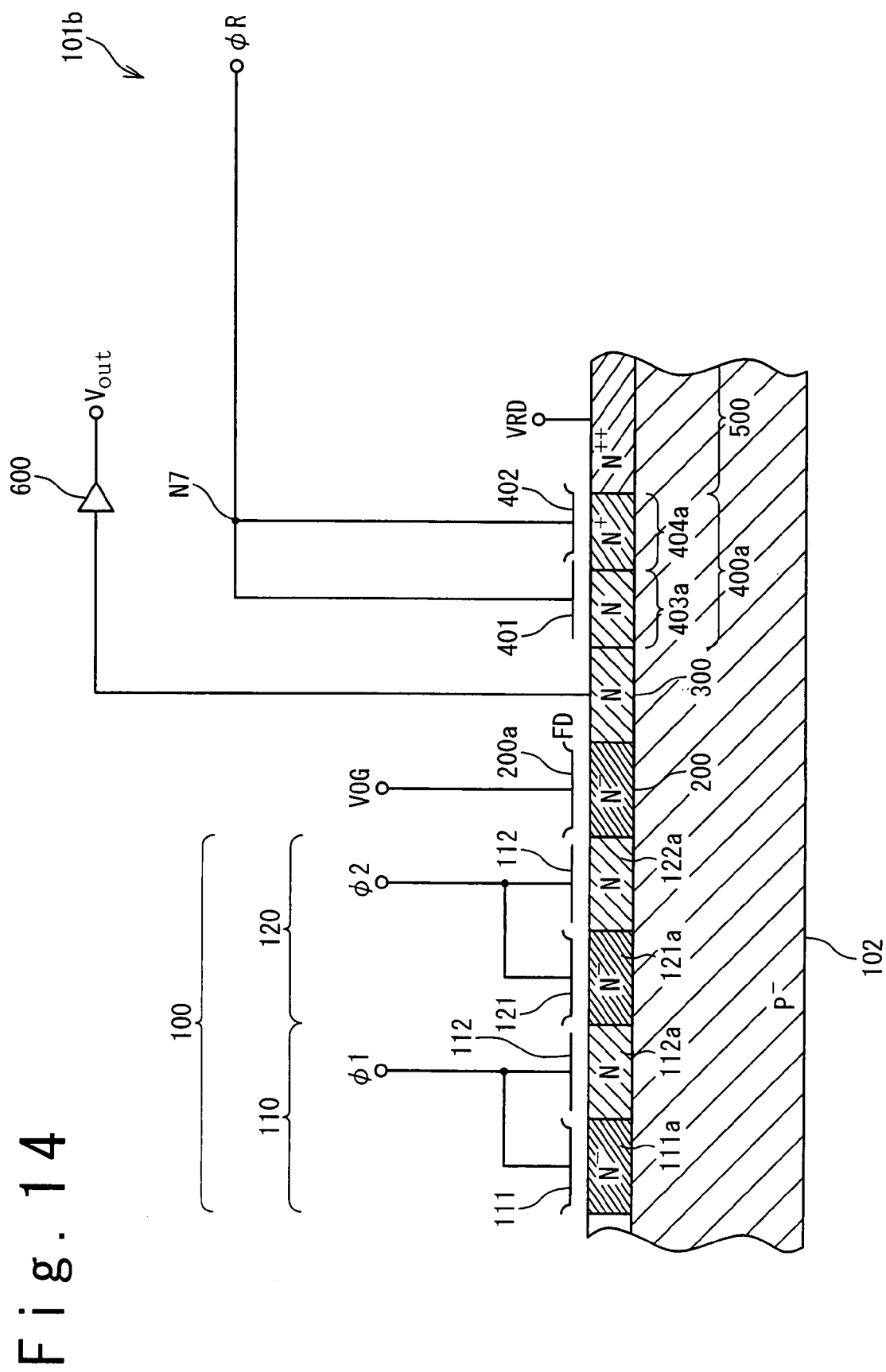
FIG. 14 is a sectional view showing an example of a constitution of a CCD image sensor 101 according to a third embodiment of the present invention.

FIG. 14 is a sectional view showing an example of a constitution of a CCD image sensor 101b according to the third embodiment of the present invention. Referring to FIG. 14, the third diffusion layer region 400a of the CCD image sensor 101b in the third embodiment includes a first-reset-portion diffusion layer region 403a and a second-reset-portion diffusion layer region 404a. As shown in FIG. 14, the first-reset-portion diffusion layer region 403a is an N-type diffusion region, and the second-reset-portion diffusion layer region 404a is an N+ type diffusion region.

In the third embodiment, in a diffusion process to form a channel region of the third diffusion layer region 400a, ions (dopant) are implanted to the second-reset-portion diffusion layer region 404a after completing the formation of the first-reset-portion diffusion layer region 403a. The ion-implantation is executed to an area from a lower part of the second reset gate electrode 402 to the fourth diffusion layer region 500 by self-aligning to the first reset gate electrode 401. Therefore, the N+ diffusion region is formed under the second reset gate electrode 402. The fourth diffusion layer region 500 is a reset drain region, and an N++ diffusion region with a high impurity concentration. Therefore, the fourth diffusion layer region 500 is not influenced by the ion-implantation to the second-reset-portion diffusion layer region 404a. Moreover, in the third embodiment, the first reset gate electrode 401 and the second reset gate electrode 402 are also directly connected to a node which supplies the reset pulse ΦR via a seventh node N7 as shown in FIG. 14.

Figures 15A, 15B, 15C, 15D:
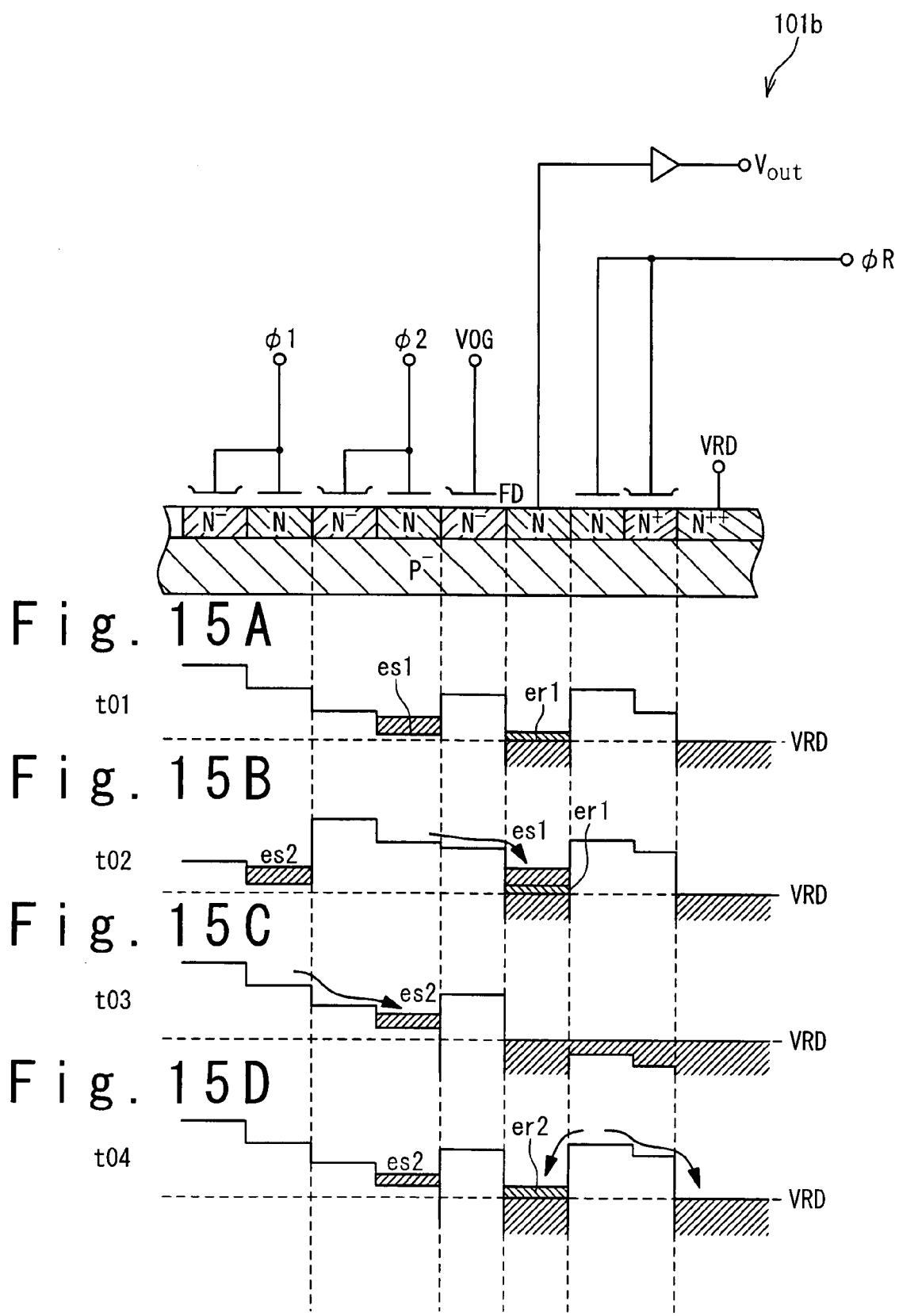
FIGS. 15A to 15D are views showing charges and potentials of a charge transfer in the CCD image sensor in the third embodiment.

An operation of the CCD image sensor 101b in the third embodiment will be explained below with reference to drawings. FIGS. 15A to 15D are views showing charges and potentials of a charge transfer in the CCD image sensor 101b in the third embodiment. In FIG. 15, the potential has + in the lower direction, and a drive timing is similar to that of FIG. 9 as mentioned above. Referring to FIG. 15, the same potential is supplied to the first reset gate electrode 401 and the second reset gate electrode 402 at time t01. At this time, an impurity concentration of the second-reset-portion diffusion layer region 404a is higher than an impurity concentration of the first-reset-portion diffusion layer region 403a. Accordingly, a potential of the third diffusion layer region 400a is made stepwise and deeper toward the side of the fourth diffusion layer region 500, in the same manner with the first and second embodiments.

Accordingly, in the CCD image sensor 101b in the third embodiment, the reset noise can be decreased by decreasing the charge amount distributed from the reset gate to the charge detecting device (FD) side, without using the shift circuit 700 or the first potential shift circuit 710 and the second potential shift circuit 720.

The first to third embodiments mentioned above can be executed in combination in a range without causing inconsistency in the configurations and operations thereof.

According to the present invention, the reset noise is decreased by decreasing the charge amount distributed from the reset gate to the charge detecting device (FD) side. Image quality improvement of a read image can be realized by decreasing the reset noise.

According to the present invention, it is also made possible to enhance a driving speed by decreasing convergence time of the reset noise.

Moreover, according to the present invention, the CCD image sensor can be configured without providing an internal driver of the device in order to increase amplitude of the reset pulse ΦR.

Furthermore, according to the present invention, the charge amount distributed from the reset gate to the charge detecting device (FD) side can be decreased without providing a shift pulse and a level shift circuit.

It is apparent that the present invention is not limited to the above embodiment, but may be modified and changed without departing from the scope and spirit of the invention.

What is claimed is:

1. An image sensor comprising:
    a reset transistor configured to include a reset gate and a reset drain, and reset charges detected by a charge detection device;
    reset gate electrodes configured to control a potential of said reset gate; and
    a potential shift circuit configured to initialize output signals in response to a shift pulse, and output said output signals to said reset gate electrodes in response to a reset pulse.

2. The image sensor according to claim 1, wherein said reset gate includes:
    a first reset gate, and
    a second reset gate configured to be formed between said reset drain and said first rest gate,
    wherein said reset gate electrodes includes:
    a first reset gate electrode configured to receive a first signal for controlling a first potential of said first reset gate, and
    a second reset gate electrode configured to receive a second signal for controlling a second potential of said second reset gate,
    wherein said potential shift circuit outputs said first signal and said second signal included in said output signals such that a potential difference between said first potential and said second potential is an approximately predetermined value.

3. The image sensor according to claim 2, wherein said potential shift circuit includes:
    a first power source configured to supply a first voltage,
    a first switch configured to be coupled to said first power source at one end, and be turned on or off in response to said shift pulse, and
    a first capacitor configured to be coupled to said second reset gate and another end of said first switch at one end, and said first reset gate through a first node supplying said reset pulse at another end.

4. The image sensor according to claim 3, wherein said reset gate electrodes controls said potential of said reset gate by said output signals such that said potential of said reset gate is made stepwise and deeper toward a side of said reset drain.

5. The image sensor according to claim 2, wherein said potential shift circuit further includes:
    a first power source configured to supply a first voltage,
    a first switch configured to be coupled to said first power source at one end, and be turned on or off in response to said shift pulse,
    a first capacitor configured to be coupled to said second reset gate and another end of said first switch and at one end, and a first node supplying said reset pulse at another end,
    a second power source configured to supply a second voltage,
    a second switch configured to be coupled to said second power source at one end, and be turned on or off in response to said shift pulse, and
    a second capacitor configured to be coupled to said first reset gate and another end of said first switch at one end, and said first node at another end.

6. The image sensor according to claim 5, wherein said reset gate electrodes controls said potential of said reset gate by said output signals such that said potential of said reset gate is made stepwise and deeper toward a side of said reset drain.

7. The image sensor according to claim 1, wherein said reset gate electrodes controls said potential of said reset gate by said output signals such that said potential of said reset gate is made stepwise and deeper toward a side of said reset drain.

8. A potential shift circuit, which is included in an image sensor, said image sensor further includes:
    a reset transistor configured to include a reset gate and a reset drain, and reset charges detected by a charge detection device, and
    reset gate electrodes configured to control a potential of said reset gate,
    said potential shift circuit comprising:
    a first node configured to output a first signal on the basis of a reset pulse;
    a second node configured to output a second signal; and
    a first capacitor configured to be provided between said first node and said second node,
    wherein said second node is coupled to a first power source through a first switch, and outputs said second signal on the basis of said first power source in response to a shift pulse inputted to said first switch, and
    said first signal and said second signal are used for controlling said potential of said reset gate.

9. The potential shift circuit according to claim 8, wherein said reset gate includes:
    a first reset gate, and
    a second reset gate configured to be formed between said reset drain and said first reset gate,
    wherein said reset gate electrodes includes:
    a first reset gate electrode configured to receive said first signal for controlling a first potential of said first reset gate, and
    a second reset gate electrode configured to receive said second signal for controlling a second potential of said second reset gate.

10. The potential shift circuit according to claim 8, further comprising:
    a third node configured to output a third signal; and
    a second capacitor configured to be provided between said first node and said third node,
    wherein said third node is coupled to a second power source through a second switch, and outputs a third signal on the basis of said second power source in response to said shift pulse inputted to said second switch, and said third signal is further used for controlling said potential of said reset gate.

11. The potential shift circuit according to claim 10, wherein said reset gate includes:
   a first reset gate, and
   a second reset gate configured to be formed between said reset drain and said first reset gate,
   wherein said reset gate electrodes includes:
   a first reset gate electrode configured to receive said third signal for controlling a first potential of said first reset gate, and
   a second reset gate electrode configured to receive said second signal for controlling a second potential of said second reset gate.

12. An image sensor comprising:
   a reset transistor configured to include a reset gate and a reset drain, and reset charges detected by a charge detection device; and
   reset gate electrodes configured to control a potential of said reset gate,
   wherein said reset gate includes:
   a first diffusion region configured to have a first impurity concentration, and
   a second diffusion region configured to have a second impurity concentration higher than said first impurity concentration, and
   wherein said reset gate electrodes include:
   a first reset gate electrode configured to control a potential of said first diffusion region, and
   a second reset gate electrode separate from the first reset gate electrode and configured to control a potential of said second diffusion region.

13. The image sensor according to claim 12, wherein said reset gate electrodes controls said potential of said reset gate by an output signal such that said potential of said reset gate is made stepwise and deeper toward a side of said reset drain.

* * * * *